(12) United States Patent
Wakimoto

(10) Patent No.: US 12,002,873 B2
(45) Date of Patent: Jun. 4, 2024

(54) METHOD FOR ADJUSTING GROOVE DEPTH AND METHOD FOR MANUFACTURING SEMICONDUCTOR DEVICE

(71) Applicant: FUJI ELECTRIC CO., LTD., Kawasaki (JP)

(72) Inventor: Setsuko Wakimoto, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 268 days.

(21) Appl. No.: 17/481,424

(22) Filed: Sep. 22, 2021

(65) Prior Publication Data

US 2022/0140113 A1 May 5, 2022

(30) Foreign Application Priority Data

Nov. 4, 2020 (JP) ................................. 2020-184613

(51) Int. Cl.
| | |
|---|---|
| H01L 29/66 | (2006.01) |
| H01L 21/3065 | (2006.01) |
| H01L 29/10 | (2006.01) |
| H01L 29/16 | (2006.01) |
| H01L 29/40 | (2006.01) |
| H01L 29/423 | (2006.01) |

(52) U.S. Cl.
CPC .... *H01L 29/66734* (2013.01); *H01L 21/3065* (2013.01); *H01L 29/1608* (2013.01); *H01L 29/401* (2013.01); *H01L 29/1095* (2013.01); *H01L 29/4236* (2013.01)

(58) Field of Classification Search
CPC ............. H01L 29/66734; H01L 29/401; H01L 29/1608; H01L 29/1095; H01L 29/4236; H01L 21/3065
USPC ........................................................ 438/270
See application file for complete search history.

(56) References Cited

U.S. PATENT DOCUMENTS

| | | | |
|---|---|---|---|
| 9,825,164 B2 | 11/2017 | Kagawa et al. | |
| 10,439,060 B2 | 10/2019 | Ohse et al. | |
| 2012/0058617 A1* | 3/2012 | Watanabe | ........... H01L 29/7802 257/E21.409 |
| 2012/0115327 A1* | 5/2012 | Miki | ................... H01L 21/3081 257/E21.585 |

(Continued)

FOREIGN PATENT DOCUMENTS

| | | | |
|---|---|---|---|
| CN | 111933574 A | * | 11/2020 |
| JP | 2010287823 A | | 12/2010 |

(Continued)

*Primary Examiner* — Igwe U Anya

(57) ABSTRACT

The method for adjusting a groove depth includes: preparing masks having different thicknesses on respective top surfaces of a plurality of substrates made of silicon carbide; forming a first opening having a predetermined width and a second opening having a width wider than the first opening in each of the masks; simultaneously forming a first groove and a second groove in each of the substrates by selectively etching via the first opening and the second opening; measuring a depth ratio of the first groove to the second groove in each of the substrates; and acquiring a thickness of a mask such that the depth ratio is an intended value, from a relationship between each thickness of the masks and each depth ratio in the substrate.

12 Claims, 19 Drawing Sheets

(56) References Cited

U.S. PATENT DOCUMENTS

2013/0337650 A1* 12/2013 Lee ..................... H01L 21/302
257/E21.214
2016/0190307 A1* 6/2016 Kagawa ............. H01L 29/0615
257/77
2018/0366574 A1 12/2018 Ohse et al.

FOREIGN PATENT DOCUMENTS

| JP | 2011018870 A | * | 1/2011 |
| JP | 6099749 B2 | | 3/2017 |
| JP | 20194078 A | | 1/2019 |

* cited by examiner

METHOD FOR ADJUSTING GROOVE DEPTH AND METHOD FOR MANUFACTURING SEMICONDUCTOR DEVICE

CROSS REFERENCE TO RELATED APPLICATIONS

This application is based upon and claims the benefit of priority from the prior Japanese Patent Application No. 2020-184613 filed on Nov. 4, 2020, the entire contents of which are incorporated herein by reference.

BACKGROUND OF THE INVENTION

1. Field of the Invention

The present invention relates to a method for adjusting a groove depth and a method for manufacturing a semiconductor device, and more particularly to a method for adjusting a groove depth of a silicon carbide (SiC) semiconductor device and a method for manufacturing a SiC semiconductor device.

2. Description of the Related Art

Generally, silicon (Si) semiconductors have been used in power semiconductor devices, which are mainly used in power conversion devices and the like. Recently, SiC, which is a wide-gap semiconductor, is expected as a semiconductor material to replace Si. Compared to conventional semiconductor elements using Si as a semiconductor material, SiC semiconductor elements have advantages in that the resistance of the devices in on-state may be reduced to a few hundredths, and the devices can be used in higher temperature environments, for example, 200° C. or higher. Such advantages are largely attributable to the properties of the material itself in which the band gap of SiC is about three times larger than that of Si and the dielectric breakdown electric-field strength is nearly one order of magnitude larger than that of Si.

As the SiC semiconductor devices, Schottky barrier diodes (SBDs), planar vertical MOS field effect transistors (FETs), trench MOSFETs, and the like have ever been commercialized. A trench MOSFET is a semiconductor device having a three-dimensional structure in which a groove, or a trench, is formed in a SiC semiconductor substrate and the sidewall of the groove is used as a channel. Therefore, among the elements having the same on-resistances, the trench MOSFET can have an overwhelmingly smaller element area than the planar vertical MOSFET, and the trench MOSFET is considered to be a particularly promising semiconductor element structure.

Normally, a plurality of chip regions on which semiconductor devices are formed are arranged on a semiconductor substrate for manufacturing a SiC semiconductor device. In the case of the trench MOSFET, each chip region has an active area in which a plurality of narrow trenches of 1 μm or less are formed, and an outer-peripheral area in which a wide mesa-groove having a width of 5 μm or more and 200 μm or less is formed so as to surround the active area. If the trenches and the mesa-groove are simultaneously formed by a general dry etching method, the depths of the trenches and the mesa-groove will be different due to the loading effect.

In the case of Si, since the process window for trench etching is wide, it is possible to suppress the loading effect by adjusting process conditions such as executing dry etching at low pressure. However, in the case of SiC, the trench etching is more difficult in comparison to Si, and the dry etching conditions are narrow. For example, in order to obtain an ideal trench shape for the trench MOSFET, it is necessary to finely adjust the flow-rate ratio of etching gases, but the loading effect often may not be suppressed with such condition. As described above, in SiC, it is extremely difficult to find a process condition which is compatible with suppressing the loading effect and adjusting the trench shape.

For the above reason, JP 2019-4078 A describes that, in the case of the SiC trench MOSFET, the etching processes of the trench and the mesa-groove are individually executed in order to adjust the respective depths of the trench and the mesa groove. Since the trench and the mesa groove are formed by etching respectively, the respective etching depths can be independently adjusted. However, an etching-mask forming process required for etching, which includes steps of depositing an oxide film, delineating a mask-pattern, removing the mask-pattern and the like, should be executed twice, and thus, the manufacturing cost of the semiconductor device may increase.

Further, in JP 6099749 B, it is described that the trench in the active area and the mesa-groove having wider width than the trench in the outer-edge area surrounding the active area are formed by reactive ion etching (RIE) using the silicon dioxide film having a thickness of 1.0 to 2.0 μm as a mask. JP 6099749 B describes that the depths of the trench and the mesa-groove are about 0.5 to 3.0 μm, but does not describe whether the depths of the trench and the mesa groove are the same or different. Moreover, in JP 6099749 B, there is no description about the loading effect, and also no mention to the process conditions of RIE.

SUMMARY OF THE INVENTION

In order to achieve the above-mentioned object, a first aspect of the present invention inheres in a method for adjusting a groove depth, includes: (a) preparing masks having different thicknesses on respective top surfaces of a plurality of substrates made of silicon carbide; (b) forming a first opening having a predetermined width and a second opening having a width wider than the first opening in each of the masks; (c) simultaneously forming a first groove and a second groove in each of the substrates by selectively etching via the first opening and the second opening; (d) measuring a depth ratio of the first groove to the second groove in each of the substrates; and (e) acquiring a thickness of a mask such that the depth ratio is an intended value, from a relationship between each thickness of the masks and each depth ratio in the substrate.

A second aspect of the present invention inheres in a method for manufacturing a semiconductor device, including: (a) obtaining a first width of a trench which implements an insulated gate structure arranged in an active area and a second width of a mesa-groove which is arranged so as to surround the active portion in an outer-edge area, the second width being wider than the first width; (b) acquiring a mask thickness capable of etching the trench having the first width and the mesa-groove having the second width to the same depth by the method for adjusting the groove depth according to the first aspect; (c) forming a base region of a second conductive type on a top surface of a drift region of a first conductive type in a target substrate made of silicon carbide; (d) selectively forming a source region of the first conductive type having a higher impurity concentration than the drift region in an upper portion of the base region; (e)

depositing a target mask on top surfaces of the source region and the base region with the mask thickness; (f) forming a first opening having the first width and a second opening having the second width in the target mask; (g) simultaneously forming the trench and the mesa-groove in the target substrate by selectively etching via the first opening and the second opening; and (h) forming an insulated-gate electrode structure in the trench.

DETAILED DESCRIPTION

Figure 1:
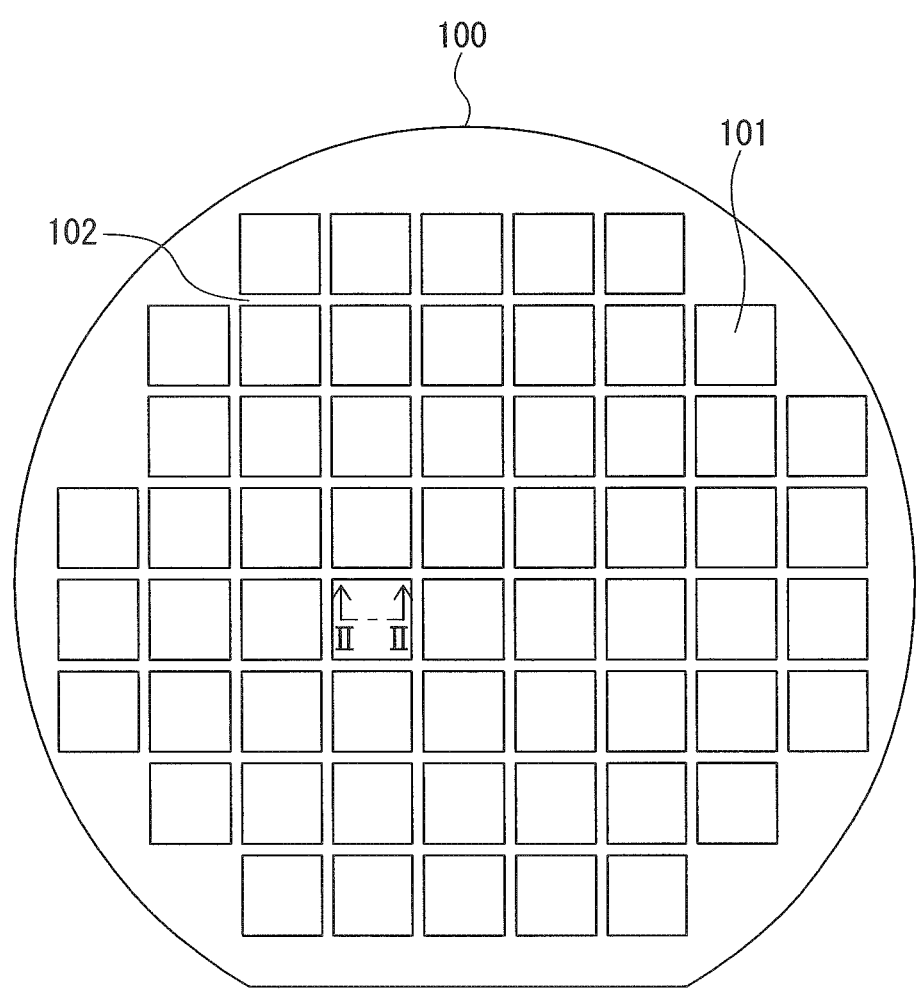
FIG. 1 is a schematic plan view illustrating an example of a SiC semiconductor device according to an embodiment of the present invention.

Hereinafter, embodiments of the present invention will be described with reference to the drawings. In the descriptions of the drawings, the same or similar parts are denoted by the same or similar reference numerals, and duplicate explanation is omitted. However, the drawings are schematic, the relationship between the thickness and the plane dimension, the ratio of the thickness of each layer, etc. may be different from the actual one. In addition, parts having different dimensional relations and ratios may also be included between drawings. In addition, the embodiments described below exemplify apparatuses and methods for embodying the technical idea of the present invention, and the technical idea of the invention does not specify the material, shape, structure, or arrangement of the elements described below.

In the present specification, the source region of the MOS transistor is the "one main region (first main region)" that can be selected as the emitter region of the insulated gate bipolar transistor (IGBT). Further, in a thyristor such as a MOS-controlled electrostatic induction thyristor (SI thyristor), one main region can be selected as a cathode region. The drain region of the MOS transistor is the "other main region (second main region)" of the semiconductor device, which can be selected as the collector region in the IGBT and the anode region in the thyristor. As used herein, the term "main region" means either the first main region or the second main region, which is appropriate from the common general technical knowledge of those skilled in the art.

Further, in the following descriptions, the terms relating to directions, such as "top and bottom" are merely defined for illustration purposes, and thus, such definitions do not limit the technical spirit of the present invention. Therefore, for example, when the paper plane is rotated by 90 degrees, the "top and bottom" are read in exchange to the "left and right". When the paper plane is rotated by 180 degrees, the "top" is changed to the "bottom", and the "bottom" is changed to the "top". Further, in the following description, the case where a first conductivity type is p-type and a second conductivity type is n-type will be exemplarily described. However, it is also possible to select the conductivity type in an inverse relationship so that the first conductivity type is n-type and the second conductivity type is p-type. Further, the superscript "+" or "−" added to the mark "n" or "p" denotes that a semiconductor region has relatively high or low impurity concentration than a region without the superscript "+" or "−" added. It should be noted that semiconductor regions denoted by the same mark, such as "n", do not necessarily have exactly the same impurity concentration. Further, in the specification, "−" in the Miller index notation denotes a bar on top of the following Miller index, and a negative index is denoted with adding "−" before the index.

<Structure of SiC Semiconductor Device>

Figure 2:
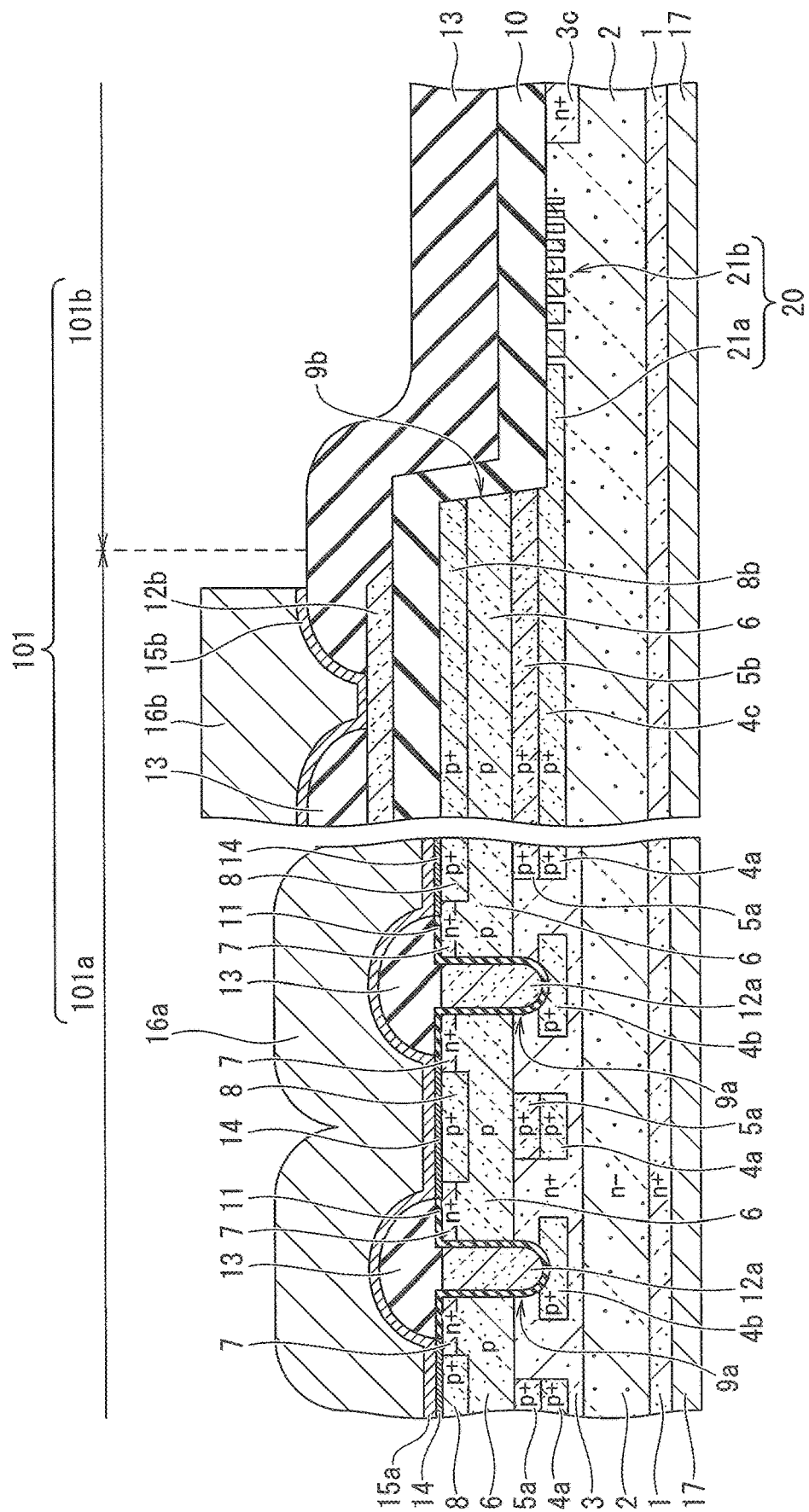
FIG. 2 is a schematic cross-sectional view taken along the line II-II in FIG. 1.

As illustrated in FIG. 1, a SiC semiconductor substrate (substrate) 100 for manufacturing a SiC semiconductor device according to an embodiment of the present invention includes a plurality of chip regions 101 and a dicing lane 102. For example, each of the chip regions 101 has a rectangular planar shape and is arranged on the substrate 100 in a matrix shape. The dicing lane 102 is arranged in a grid pattern so as to surround each of the chip regions 101. As illustrated in FIG. 2, the chip region 101 is provided with an active area 101a including an active element and an outer-edge area 101b having an edge-termination structure for breakdown-voltage. FIG. 2 illustrates the semiconductor device which includes a MOSFET having a trench gate structure as an active element, provided on a first conductivity type (n$^-$-type) drift layer 2, and an electric-field relaxation region 20 as the edge-termination structure.

As illustrated in FIG. 2, a second conductivity type (p-type) base region 6 is arranged on a top surface of the drift layer 2. The drift layer 2 and the base region 6 are provided by epitaxial growth layers (hereinafter, referred to as "epitaxial layers") made of SiC. A p$^+$-type base contact region 8 having a higher impurity concentration than the base region 6 is selectively provided on the base region 6. An n$^+$-type first main region (source region) 7 having a higher impurity concentration than the drift layer 2 is selectively provided on the base region 6 so as to be in contact with the base contact regions 8.

A trench (first groove) 9a having a width of 1 μm or less is provided so as to penetrate the base region 6 from the top surfaces of the source region 7 and the base region 6. That is, the source regions 7 and the base region 6 are in contact with a sidewall of the trench 9a. A gate insulating film 11 is provided on a bottom surface and the sidewall of the trench 9a. A gate electrode 12a is embedded in the trench 9a via the gate insulating film 11 to implement an insulated-gate electrode-structure (11, 12a). For the gate insulating film 11, in addition to a silicon oxide (SiO$_2$) film, a dielectric film, such as a silicon oxynitride (SiON) film, a strontium oxide (SrO) film, a silicon nitride (Si$_3$N$_4$) film, an aluminum oxide (Al$_2$O$_3$) film, a magnesium oxide (MgO) film, an yttrium oxide (Y$_2$O$_3$) film, a hafnium oxide (HfO$_2$) film, a zirconium oxide (ZrO$_2$) film, a tantalum oxide (Ta$_2$O$_5$) film, and a bismuth oxide (Bi$_2$O$_3$) film, may be adopted. Moreover, a single-layer film of any one of the above-mentioned dielectric films or a composite film in which the plural dielectric films are laminated, may be used. For a material of the gate electrode 12a, for example, a polysilicon layer doped with impurities, such as phosphorus (P), boron (B) and the like, at a high concentration, that is a doped polysilicon layer, may be used.

An n$^+$-type current spreading layer (CSL) 3 having a higher impurity concentration than the drift layer 2 is selectively provided on the drift layer 2. The bottom of the trench 9a reaches the current spreading layer 3. It is noted that the current spreading layer 3 does not necessarily have to be provided. When the current spreading layer 3 is not provided, the bottom of the trench 9a reaches the drift layer 2. A p$^+$-type gate-bottom protection region 4b is provided in the current spreading layer 3 so as to be in contact with the bottom of the trench 9a. In the current spreading layer 3, a first base-bottom embedded region 4a is provided below the base contact region 8 at the same depth as the gate-bottom protection region 4b and away from the gate-bottom protection region 4b. A second base-bottom embedded region 5a is provided in an upper portion of the current spreading layer 3 so as to be in contact with a top surface of the first base-bottom embedded region 4a and a bottom surface of the base region 6. The second base-bottom embedded region 5a is also provided below the base contact region 8.

An interlayer insulating film 13 is arranged on the top surface of the gate electrode 12a. For the interlayer insulating film 13, a silicon oxide film to which boron (B) and phosphorus (P) are doped, that is BPSG, may be used. However, for the interlayer insulating film 13, a silicon oxide film to which phosphorus (P) is doped, that is PSG, a non-doped SiO$_2$ film called "NSG", in which phosphorus (P) or boron (B) is not contained, a silicon oxide film to which boron (B) is doped, that is BSG, a Si$_3$N$_4$ film, or the like, may be used. Alternatively, a composite film in which the above-mentioned films are laminated, may be adopted.

A source contact layer 14 is provided so as to physically contact the source region 7 and the base contact region 8, which are exposed between the interlayer insulating film 13. A barrier-metal layer 15a is provided so as to cover the interlayer insulating film 13 and the source contact layer 14. A first main electrode (source electrode) 16a is electrically connected to the source region 7 and the base contact region 8 via the barrier-metal layer 15a and the source contact layer 14. For example, a nickel silicide (NiSi$_x$) film for the source contact layer 14, a titanium nitride (TiN) film or a titanium (Ti) film for the barrier-metal layer 15a, and an aluminum (Al) film or an aluminum-silicon (Al—Si) film for the source electrode 16a may be adopted. The source electrode 16a is separately arranged from a gate surface electrode (not illustrated).

A base contact region 8b is provided on the base region 6 in the active area 101a on a side of the outer-edge area 101b. An interconnection layer 12b is arranged above a top surface of the base contact region 8b via a field oxide film 10, and a gate-electrode pad 16b is arranged above a top surface of the interconnection layer 12b via a barrier-metal layer 15b. Although not illustrated, the gate-electrode pad 16b is electrically connected to the gate electrode 12a via the interconnection layer 12b. The interlayer insulating film 13 and the field oxide film 10 extend into the outer-edge area 101b. Further, in the active area 101a on the side of the outer-edge area 101b, a second base-bottom embedded region 5b and a first base-bottom embedded region 4c are provided so as to be in contact with a bottom surface of the base region 6.

An n$^+$-type second main region (drain region) 1 is arranged on a bottom surface of the drift layer 2. The drain region 1 is implemented by the SiC semiconductor substrate (substrate). A second main electrode (drain electrode) 17 is arranged on a bottom surface of the drain region 1. For the drain electrode 17, for example, a single-layer film made of gold (Au) or a metal film in which Ti, nickel (Ni), and Au are laminated in this order may be used, and further a metal film, such as molybdenum (Mo), tungsten (W) or the like, may be laminated as the lowermost layer of the drain electrode 17. Furthermore, a drain contact layer may be provided between the drain region 1 and the drain electrode 17. The drain contact layer may be a nickel silicide (NiSi$_x$) film, for example.

During operation of the semiconductor device according to the embodiment, a positive voltage is applied to the drain electrode 17 with the source electrode 16a as a ground potential and a positive voltage equal to or higher than a threshold voltage is applied to the gate electrode 12a. Thus, an inversion layer (a channel) is induced in the base region 6 at a sidewall of the trench 9a, to turn on. The inversion layer is formed on the side of the base region 6 located on the sidewall of the trench 9a, and the inversion layer corresponds to an interface between the gate insulating film 11, sandwiched at a position where the base region 6 faces the gate electrode 12a, and the base region 6. In the on-state, a current flows from the drain electrode 17 to the source electrode 16a via the drain region 1, the drift layer 2, the current spreading layer 3, the inversion layer in the base region 6, and the source region 7. On the contrary, when the voltage applied to the gate electrode 12a is less than the threshold voltage, the inversion layer is not induced in the base region 6 to turn off, and thus no current flows from the drain electrode 17 to the source electrode 16a.

As illustrated in FIG. 2, the first base-bottom embedded region 4c extends from the active area 101a located on the left side to the outer-edge area 101b. Further, the second base-bottom embedded region 5b extends from the active area 101a located on the left side to the outer-edge area 101b. The outer-edge area 101b is provided with a mesa-groove (second groove) 9b which penetrates the base region 6 from the top surface of the base region 6 and reaches the second base-bottom embedded region 5b. The width of the mesa-groove 9b in one chip region 101 is, for example, in a range of 5 μm or more and 200 μm or less. The outer-edge area 101b is provided with a p-type electric-field relaxation region 20 so as to be exposed on a bottom surface and a side surface of the mesa-groove 9b. In the electric-field relaxation region 20, a plurality of spatial modulation portions 21b are provided at the outer end so that the average impurity concentration decreases toward the outside. The interlayer insulating film 13 is provided above the bottom surface and the side surface of the mesa groove 9b via the field oxide film 10.

As illustrated in FIG. 2, as the electric-field relaxation region 20, a junction-termination structure, referred to as a "junction termination extension (JTE)" structure, is provided from the base contact region 8 through the upper portion of the base region 6 to the vicinity of the outer end of the upper portion of the drift layer 2. The electric-field relaxation region 20 extends to the outside of the second base-bottom embedded region 5b.

The JTE structure of the electric-field relaxation region 20 includes a main body 21a extending from the base contact region 8 through the upper portion of the base region 6 to the outside of the first base-bottom embedded region 4c, and the spatial modulation portions 21b in an outside of the main body 21a. Each of the spatial modulation portions 21b is provided in a concentric ring shape so as to be separated from each other. For example, the spatial modulation portions 21b implement a spatial modulation pattern in which each width of the spatial modulation portions 21b becomes narrower and each interval between the the spatial modulation portions 21b becomes wider toward the outside.

Since the JTE structure of the electric-field relaxation region 20 has the spatial modulation portions 21b, the doping amount of p-type impurities in the electric-field relaxation region 20 is effectively decreased toward the outside, and thus the electric field concentration can be relaxed.

In the outer end of the outer-edge area 101b, an n$^+$-type channel stopper 3c is provided concentrically on the upper portion of the drift layer 2. A p$^+$-type channel stopper may be provided instead of the n$^+$-type channel stopper 3c.

<Adjusting Method of Groove Depth>

As illustrated in FIG. 2, the semiconductor device according to the embodiment includes the trench 9a and the mesa-groove 9b having different widths. For example, the trench 9a is a narrow groove of 1 μm or less, while the mesa-groove 9b is a wide groove of 5 μm or more and 200 μm or less. The outer-edge area 101b of the subject chip region 101 faces another outer-edge area 101b of the other chip region 101 via the dicing lane 102. Therefore, when a depth of the dicing lane 102 is formed with the same depth as that of the mesa-groove 9b, the substantial groove width for the wide groove may be the sum of widths of the two adjacent mesa-grooves 9b and the width of the dicing lane 102. Considering such a case as well, the groove width of the wide groove may be in a range of 5 μm or more and 400 μm or less. If the trench 9a and the mesa-groove 9b are simultaneously etched by a general dry etching method, the etching depths of the trench 9a and the mesa-groove 9b will be different due to the loading effect. It should be noted that when the groove width is 5 μm or more, the loading effect by dry etching may be small, and the etching depth may not depend on the groove width to be almost constant depth.

For example, if the depth of the trench 9a is too shallow to penetrate the base region 6, which implements the channel of the MOSFET, the on-voltage Von will increase. On the other hand, if the depth of the trench 9a is too deep and penetrates the gate-bottom protection region 4b, the breakdown voltage will be lowered. Further, if the depth of the mesa-groove 9b is too shallow to remove the base region 6, the base region 6 will remain in the bottom of the mesa-groove 9b, resulting in a leak failure. On the other hand, if the depth of the mesa-groove 9b is too deep and deeper than the first base-bottom embedded region 4c, electric field crowding occurs at the corner of the mesa-groove 9b and the breakdown voltage will be lowered. As described above, both the trench 9a and the mesa groove 9b should be deeper than the bottom of the base region 6 and shallower than the bottom of the first base-bottom embedded region 4c. Therefore, the trench 9a and the mesa-groove 9b desirably have the same depth. When the trench 9a and the mesa-groove 9b have the same depth, for example, a depth ratio between the trench 9a and the mesa-groove 9b shall be 1±0.05, more preferably 1±0.02.

Figure 3:
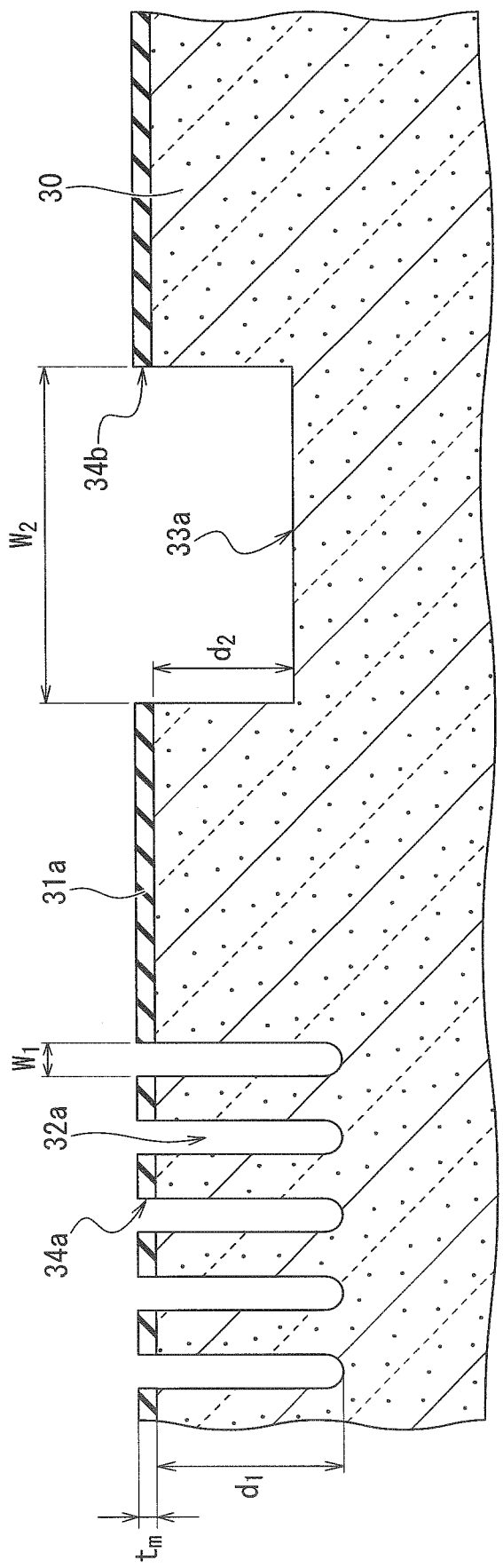
FIG. 3 is a schematic cross-sectional view illustrating an example of trench etching according to the embodiment of the present invention.

FIG. 3 illustrates an example in which a SiO$_2$ film having a film thickness $t_m$ of about 0.7 μm is deposited on a top surface of an SiC substrate 30 by chemical vapor deposition (CVD) technique. A plurality of openings 34a each having a width W$_1$ of 1 μm or less, for example, about 0.7 μm, and an opening 34b having a width W$_2$ of 5 μm or more, for example, about 100 μm, are opened in the SiO$_2$ film by photolithography technique and the like, to form a mask 31a. For SiC dry etching, high-density plasma etching technology such as inductively coupled plasma-RIE (ICP-RIE) may be adopted. As etching conditions, for example, SF$_6$/SiF$_4$/O$_2$/Ar gas mixture, applied coil-power of about 1000 W to 2000 W, bias power of about 100 W to 400 W, and chamber pressure of about 0.2 Pa to 2.0 Pa may be adopted. Since amount of Si generated as a raw material of etching products is larger in the wider opening 34b than in the opening 34a, the etching is more likely to be inhibited in the opening 34b than in the opening 34a. Therefore, as illustrated in FIG. 3, a groove depth d$_2$ of the second groove 33a etched via the opening 34b of the width W$_2$ tends to be shallower than a groove depth d$_1$ of the first groove 32a etched via the opening 34a of the width W$_1$.

Figure 4:
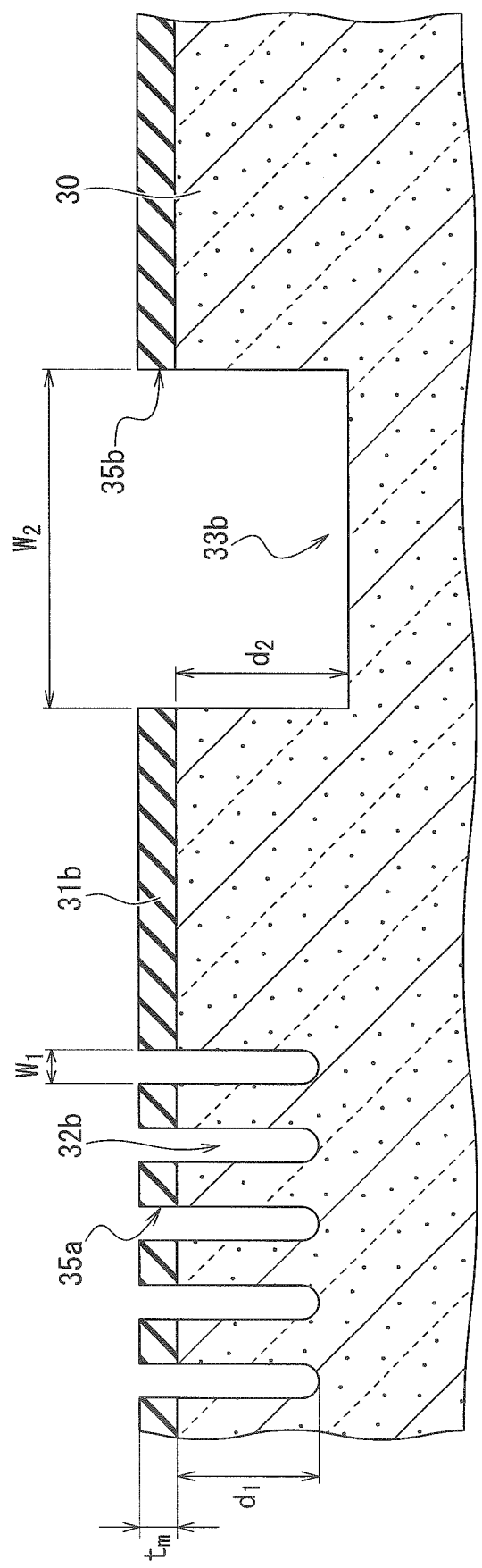
FIG. 4 is a schematic cross-sectional view illustrating another example of trench etching according to the embodiment of the present invention.

FIG. 4 illustrates an example in which a SiO$_2$ film having a film thickness $t_m$ of about 1.5 μm is deposited. Similar to the case of the SiO$_2$ film thickness of about 0.7 μm, a plurality of openings 35a each having a width W$_1$ of about 0.7 μm and an opening 35b having a width W$_2$ of about 100 μm are opened in the SiO$_2$ film to form a mask 31b. Grooves are dug in the substrate 30 using the mask 31b by ICP-RIE under the same etching conditions as described above. Similar to the case of FIG. 3, a large amount of Si as the etching products may be generated in the opening 35b of the width $W_2$, while in the narrow opening 35a of the width $W_1$, radicals and ions contributing to etching reaction hardly reach a surface of the substrate 30 exposed in the opening 35a. Therefore, as illustrated in FIG. 4, the groove depth $d_2$ of the second groove 33b etched via the opening 35b of the width $W_2$ tends to be deeper than the groove depth $d_1$ of the first groove 32b etched via the opening 35a of the width $W_1$.

Figure 5:
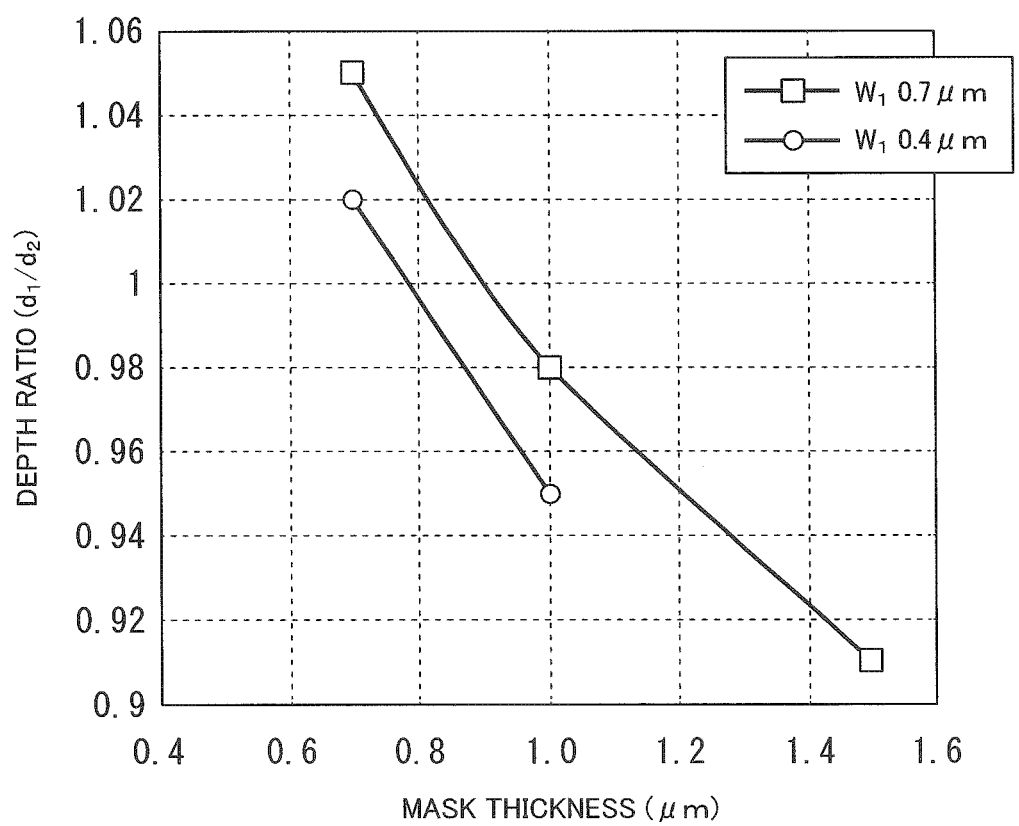
FIG. 5 is a diagram illustrating a relationship of depth ratio of a trench to a mesa-groove with respect to a film thickness of a mask.

FIG. 5 illustrates a relationship between a mask thickness and the depth ratio of the first groove and the second groove when the width $W_1$ of the first groove is about 0.7 µm. Also. FIG. 5 illustrates a relationship between the mask thickness and the depth ratio of the first groove and the second groove when the width $W_1$ of the first groove is about 0.4 µm. As illustrated in FIG. 5, in both cases where the widths of the first groove are 0.7 µm and 0.4 µm, the depth ratio of the first groove to the second groove tends to decrease as the mask thickness is increased. Therefore, in order to adjust the depth ratio of the first groove to the second groove to about 1, the mask thickness may be about 0.9 µm when the first groove is 0.7 µm, and the mask thickness may be about 0.8 µm when the first groove is 0.4 µm. It should be noted that the relationship illustrated in FIG. 5 is only an example, and the $SiO_2$ film thickness of the mask where the depth ratio of the first groove to the second groove is 1 may be different depending on the conditions, such as etching apparatus, process conditions, opening ratio of the mask, and the like. Even in such case, when two or more $SiO_2$ films having different thicknesses are prepared and the relationship between the film thickness and the depth ratio is obtained by experiments, the mask thickness where the depth ratio of the first groove to the second groove is 1 may be calculated. Specifically, it is preferable to use a plurality of SiC semiconductor substrates in which $SiO_2$ films having different thicknesses are deposited, respectively.

An adjusting method of groove depth of the present invention will be described by applying to a manufacturing method of semiconductor device with reference to a flowchart illustrated in FIG. 6. Note that the adjusting method of the groove depth described below is merely an example and may be achieved by various other manufacturing methods including a modification as long as the gist described in the claims is included.

Figure 6:
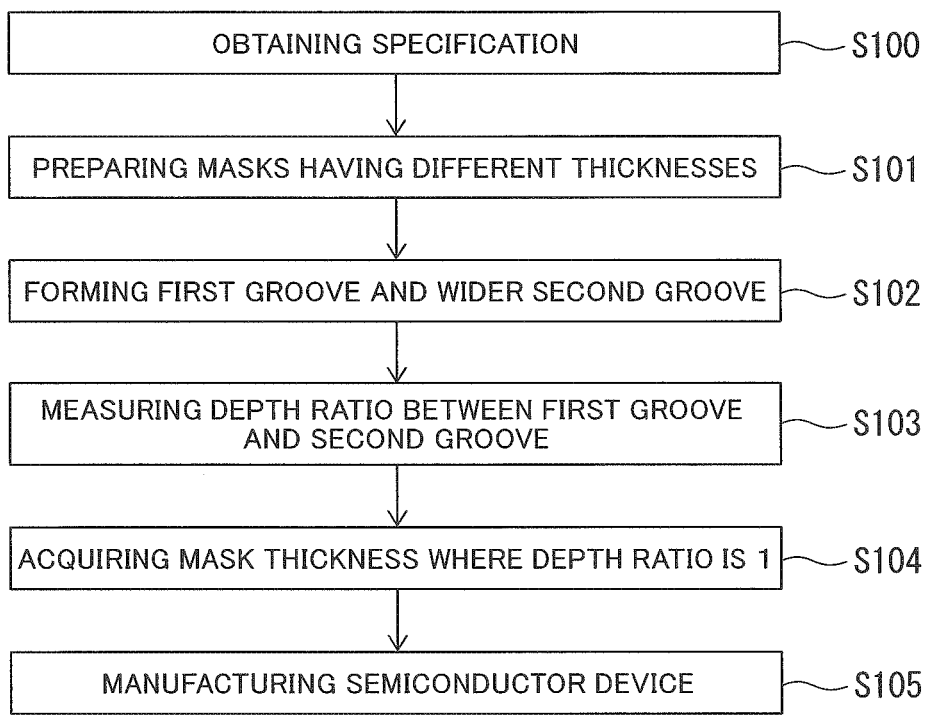
FIG. 6 is a flowchart illustrating an example of an adjusting method for the groove depth according to the embodiment of the present invention.

First, in step S100 of the flowchart illustrated in FIG. 6, a width of the trench as the first groove and a width of the mesa-groove as the second groove are obtained from a specification of a semiconductor device to be manufactured. When the dicing lane 102 is also specified to be the same depth as the mesa-groove 9b, a sum of the widths of the two mesa-grooves in the adjacent chip regions and a width of the dicing lane 102 may be adopted as the width of the second groove. For example, the width of the first groove is 1.0 µm or less, and the width of the second groove is 5 µm or more and 400 µm or less.

In step S101, $SiO_2$ films having different film thicknesses are deposited on a plurality of SiC semiconductor substrates by CVD technique and the like. Then, openings corresponding to the first groove and the second groove are opened in each of the $SiO_2$ films by photolithography technique and the like, to prepare a mask on each of the semiconductor substrates.

In step S102, the first groove and the second groove are simultaneously dug and formed in each semiconductor substrate via the openings using the mask by dry etching technique. In step S103, a depth ratio of the first groove to the second groove in each semiconductor substrate is measured. Then, a mask thickness is acquired such that the depth ratio of the first groove to the second groove is about 1, for example, 1±0.05, more preferably 1±0.02. Then, in step S105, in manufacturing the semiconductor device, the trench and the mesa-groove are simultaneously formed by dry etching and the like using the acquired mask thickness. In addition, the mask material and the openings corresponding to the first groove and the second groove are the same as those in step 102.

According to the adjusting method of the groove depth according to the embodiment, the trench and the mesa-groove can be simultaneously etched to form the trench and the mesa-groove with comparable groove depths in the manufacture of the semiconductor device. Therefore, a number of exposure masks used in the photolithography process can be reduced by one. Moreover, the man-hours required for the processes, such as photolithography, dry etching and the like, of forming the trench and the mesa-groove can be reduced, and it is possible to cut the cost of the semiconductor device.

<Manufacturing Method of Insulated-Gate Semiconductor Device>

Next, the manufacturing method of the SiC semiconductor device according to the embodiment will be given by taking a trench gate MOSFET as an example, with reference to the cross-sectional views of FIGS. 7 to 19. The $SiO_2$ film is used as the etching mask for the trench (first groove) and the mesa-groove (second groove), and inductively coupled plasma-RIE (ICP-RIE) may be adopted as dry etching. Note that the manufacturing method of the trench gate MISFET described below is merely an example and may be achieved by various other manufacturing methods including a modification as long as the gist described in the claims is included.

Figure 7:
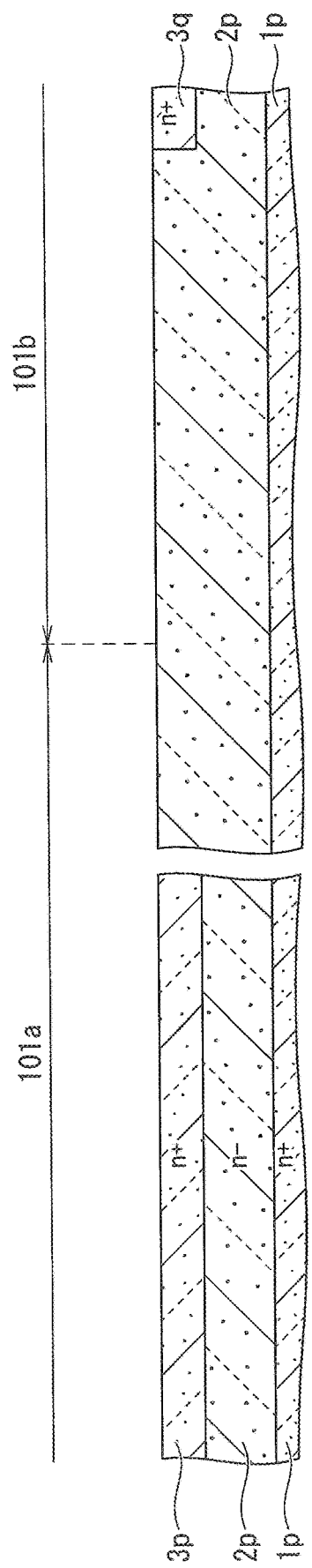
FIG. 7 is a schematic cross-sectional view illustrating an example of a process in a manufacturing method of the semiconductor device according to the embodiment of the present invention.

First, prepare an n$^+$-type SiC semiconductor substrate (substrate) 1p in which n-type impurity atoms, such as nitrogen (N) and the like, are doped, is prepared. As illustrated in FIG. 7, the n$^-$-type drift layer 2p is epitaxially grown on a top surface of the substrate 1p. Then, a photoresist film is coated on a top surface of the drift layer 2p, and the coated photoresist film is delineated by photolithography technique and the like. The delineated photoresist film is used as a mask for ion implantation, so as to selectively implant n-type impurity ions, such as nitrogen (N) and the like, from the top surface side of the drift layer 2p into the active area 101a and an outer end of the outer-edge area 101b of the drift layer 2 by multiple-energy ion implantation. Thus, an n-ion implanted layer 3p is formed in the active area 101a of the drift layer 2p, and an n-ion implanted layer 3q is formed at the outer end of the outer-edge area 101b.

Figure 8:
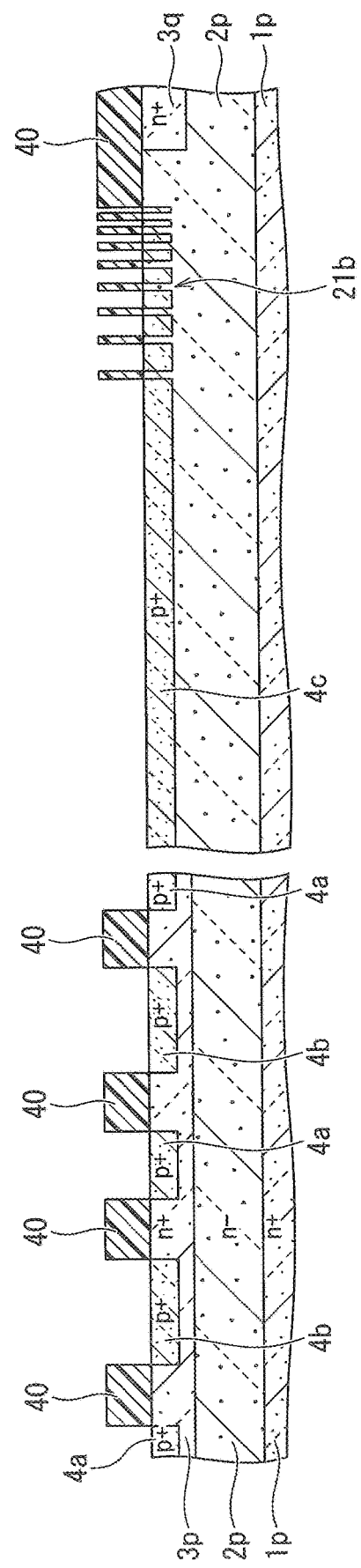
FIG. 8 is a schematic cross-sectional view illustrating an example of a process subsequent to FIG. 7 in the manufacturing method of the semiconductor device according to the embodiment of the present invention.

An oxide film made of $SiO_2$ is deposited on top surfaces of the n-ion implanted layers 3p, 3q and the drift layer 2p by CVD technique and the like. A photoresist film is coated on an top surface of the deposited oxide film, and the oxide film is delineated by photolithography technique, dry etching technique and the like. The delineated oxide film 40 is used as a mask for ion implantation, to implant p-type impurity ions, such as aluminum (Al) and the like, into the n-ion implanted layer 3p and the drift layer 2p by multiple-energy ion implantation. As a result, as illustrated in FIG. 8, the first base-bottom embedded region 4a and the gate-bottom protection region 4b are selectively formed in an upper portion of the n-ion implanted layer 3p, and the first base-bottom embedded region 4c and the spatial modulation portions 21b are selectively formed in an upper portion of the drift layer 2p.

Figure 9:
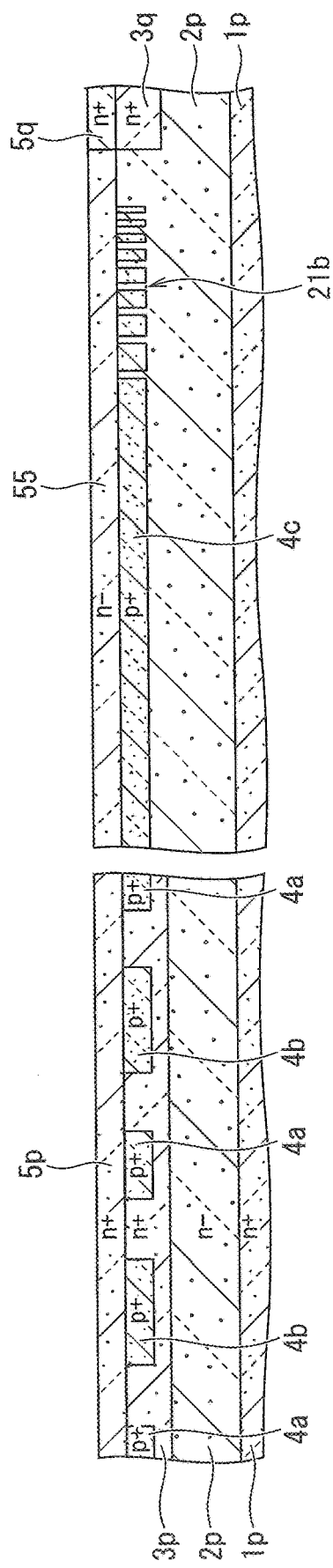
FIG. 9 is a schematic cross-sectional view illustrating an example of a process subsequent to FIG. 8 in the manufacturing method of the semiconductor device according to the embodiment of the present invention.

After removing the oxide film 40, an n-type epitaxial layer 55 is grown on top surfaces of the first base-bottom embedded region 4a, 4c, the gate-bottom protection region 4b, the spatial modulation portion 21b, the drift layer 2p, the n-ion implanted layer 3q. A photoresist film is coated on a top surface of the epitaxial layer 55, and the coated photoresist film is delineated by photolithography technique and the like. The delineated photoresist film is used as a mask for ion implantation, to selectively implant n-type impurity ions, such as nitrogen (N) and the like, from the top surface side of the epitaxial layer 55 into an upper portion of the epitaxial layer 55 by multiple-energy ion implantation. As a result, as illustrated in FIG. 9, n-ion implanted layers 5p, 5q are formed on the n-ion implantation layers 3p, 3q, the first base-bottom embedded region 4a and the gate-bottom protection region 4b.

Figure 10:
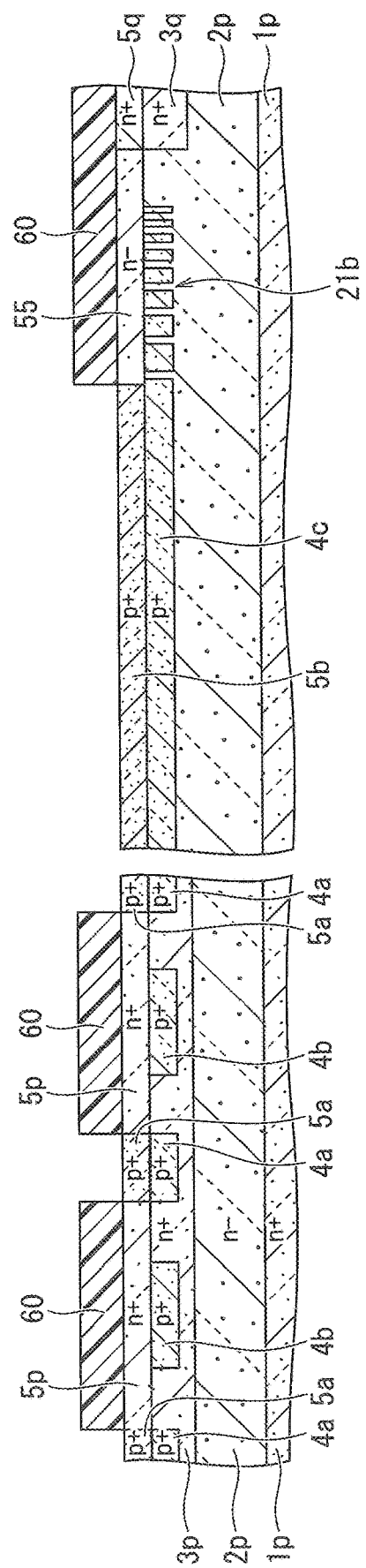
FIG. 10 is a schematic cross-sectional view illustrating an example of a process subsequent to FIG. 9 in the manufacturing method of the semiconductor device according to the embodiment of the present invention.

Then, an oxide film made of $SiO_2$ is deposited on top surfaces of the n-ion implanted layers 5p, 5q and the epitaxial layer 55 by CVD technique and the like. A photoresist film is coated on a top surface of the oxide film, and the oxide film is delineated by photolithography technique, dry etching technique and the like. The delineated oxide film 60 is used as a mask for ion implantation, to selectively implant p-type impurity ions, such as aluminum (Al) and the like, into the n-ion implanted layer 5p and the epitaxial layer 55 by multiple-energy ion implantation. As a result, as illustrated in FIG. 10, second base-bottom embedded regions 5a, 5b are selectively formed on the first base-bottom embedded regions 4a, 4c, respectively.

Figure 11:
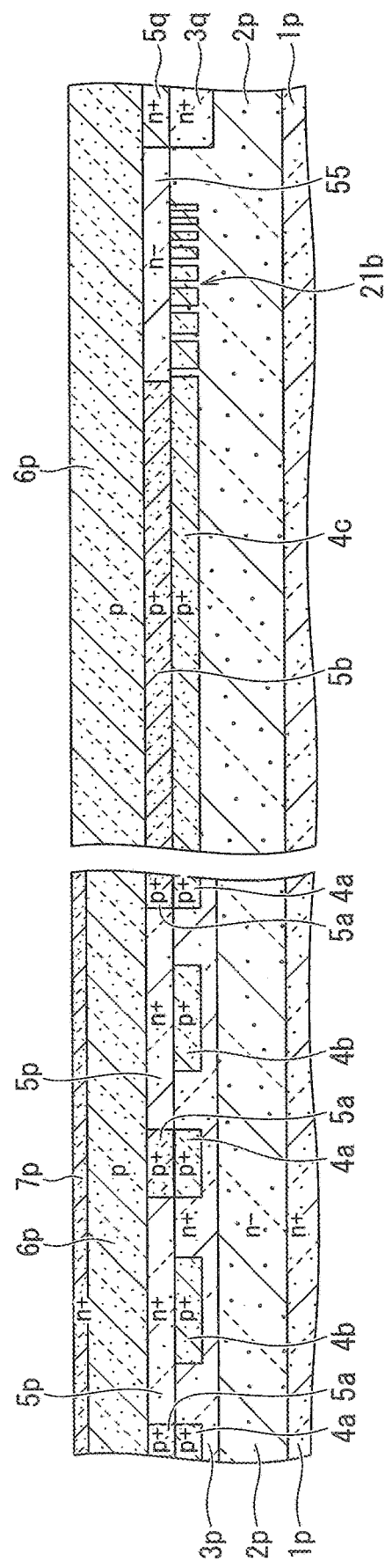
FIG. 11 is a schematic cross-sectional view illustrating an example of a process subsequent to FIG. 10 in the manufacturing method of the semiconductor device according to the embodiment of the present invention.

After removing the oxide film 60, a p-type base region 6p is epitaxially grown on top surfaces of the second base-bottom embedded region 5a, 5b, n-ion implanted layer 5p, 5q and the epitaxial layer 55. An oxide film made of $SiO_2$ is deposited on a top surface of the base region 6p by CVD technique and the like. A photoresist film is coated on a top surface of the oxide film, and the oxide film is delineated by photolithography technique, dry etching technique and the like. The delineated oxide film is used as a mask for ion implantation, to selectively implant n-type impurity ions, such as phosphorus (P) and the like, from the top surface side of the base region 6p into the base region 6p by multiple-energy ion implantation. As a result, as illustrated in FIG. 11, a source region 7p is formed on the top surface of the base region 6p above the second base-bottom embedded region 5a and the n-ion implanted layer 5p.

Figure 12:
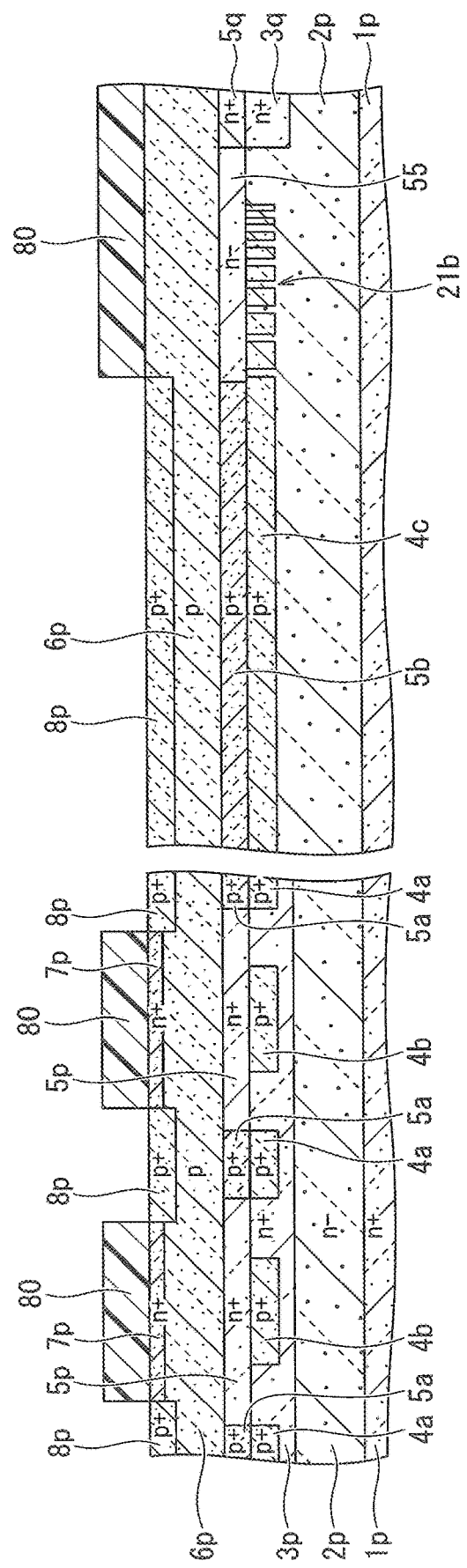
FIG. 12 is a schematic cross-sectional view illustrating an example of a process subsequent to FIG. 11 in the manufacturing method of the semiconductor device according to the embodiment of the present invention.

After removing the oxide film used as the mask for the ion implantation, an oxide film made of $SiO_2$ is deposited on top surfaces of the source region 7p and the base region 6p by CVD technique and the like. A photoresist film is coated on a top surface of the oxide film, and the oxide film is delineated by photolithography technique, dry etching technique and the like. The delineated oxide film 80 is used as a mask for ion implantation, to selectively implant p-type impurity ions, such as aluminum (Al) and the like, into the source region 7p and the base region 6p from the top surface side of the source region 7p and the base region 6p by multiple-energy ion implantation. As a result, as illustrated in FIG. 12, a base contact region 8p is formed on the top surfaces of the source region 7p and the base region 6p above the second base-bottom embedded region 5a, 5b, respectively.

Figure 13:
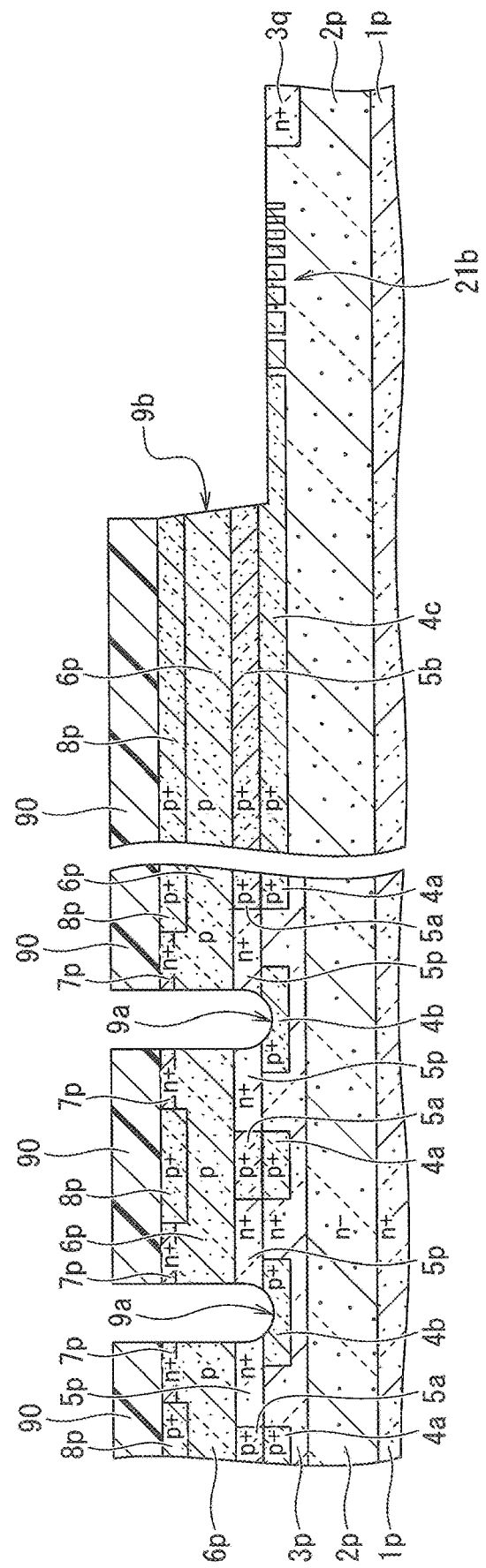
FIG. 13 is a schematic cross-sectional view illustrating an example of a process subsequent to FIG. 12 in the manufacturing method of the semiconductor device according to the embodiment of the present invention.

After removing the oxide film 80 used as the mask for the ion implantation, an oxide film made of $SiO_2$ is deposited on top surfaces of the base contact region 8p, the source region 7p and the base region 6p by CVD technique and the like. A thickness of the oxide film is acquired in advance according to the adjusting method of groove depth described with reference to the flowchart of FIG. 6. Further, when an actual thickness of the oxide film to be deposited is within ±5% of a value of the acquired thickness of the oxide film according to the adjusting method of groove depth, the actual thickness of the deposited oxide film may be considered to be the same as the acquired value. A photoresist film is coated on a top surface of the oxide film, and the oxide film is delineated by photolithography technique, dry etching technique and the like. The delineated oxide film 90 is used as an etching mask, to simultaneously form the trench 9a and the mesa groove 9b by selectively etching to the same depth by dry etching technique such as ICP-RIE and the like. For example, in the case of ICP-RIE using the $SF_6/SiF_4/O_2/Ar$ gas mixture, the following etching conditions may be adopted. The etching conditions are: applied coil-power; about 1000 W to 2000 W, bias power; about 100 W to 400 W, and chamber pressure; about 0.2 Pa to 2.0 Pa. As illustrated in FIG. 13, the trench 9a penetrates the source region 7p, the base region 6p and the n-ion implanted layer 5p to reach the gate-bottom protection region 4b. The mesa groove 9b penetrates the base contact region 8p, the base region 6p, the second base-bottom embedded region 5b, the epitaxial layer 55 and the n-ion implanted layer 5q to reach the first base-bottom embedded region 4c, the spatial modulation portions 21b, the drift layer 2p and the n-ion implanted layer 3q.

Figure 14:
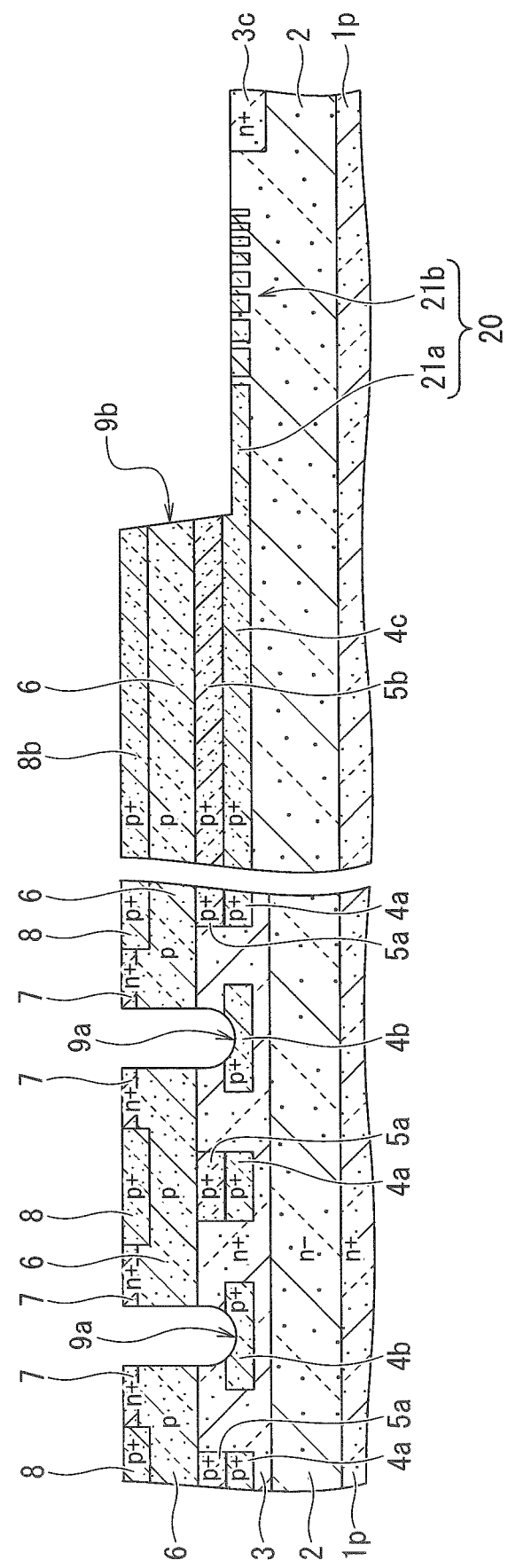
FIG. 14 is a schematic cross-sectional view illustrating an example of a process subsequent to FIG. 13 in the manufacturing method of the semiconductor device according to the embodiment of the present invention.

After removing the oxide film 90, a carbon (C) film is deposited on top surfaces of the trench 9a and the mesa groove 9b by carbon sputtering technique and the like. Then, the implanted n-type impurity ions and p-type impurity ions are simultaneously activated by annealing. As a result, as illustrated in FIG. 14, the $n^+$-type current spreading layer 3 implemented by the n-ion implanted layer 3p and the n-ion implanted layer 5p is formed on the top surface of the drift layer 2. The $p^+$-type first base-bottom embedded region 4a in the upper portion of the current spreading layer 3, the $p^+$-type second base-bottom embedded region 5a sandwiched between the first base-bottom embedded region 4a and the base region 6, and the $p^+$-type gate-bottom protection region 4b on the bottom of the trench 9a are formed. The $p^+$-type first base-bottom embedded region 4c on the drift layer 2, and the $p^+$-type second base-bottom embedded region 5b sandwiched between the first base-bottom embedded region 4c and the base region 6 are formed. Further, the $n^+$-type source regions 7 on the top surface of the base region 6 so as to be in contact with the trench 9a, and the $p^+$-type base contact region 8 sandwiched between the source regions 7 on the top surface of the base region 6 are formed. Furthermore, the electric-field relaxation region 20 is formed in the bottom surface of the mesa groove 9b. The electric-field relaxation region 20 is implemented by the JTE structure having the $p^+$-type main body 21a extending from the first base-bottom embedded region 4c and the $p^+$-type spatial modulation portions 21b. The $n^+$-type channel stopper 3c is formed in the upper portion of the drift layer 2 in the outer end of the bottom of the mesa groove 9b. The $n^+$-type channel stopper 3c is implemented by the n-ion implanted layer 3q of a portion remaining by dry etching.

Figure 15:
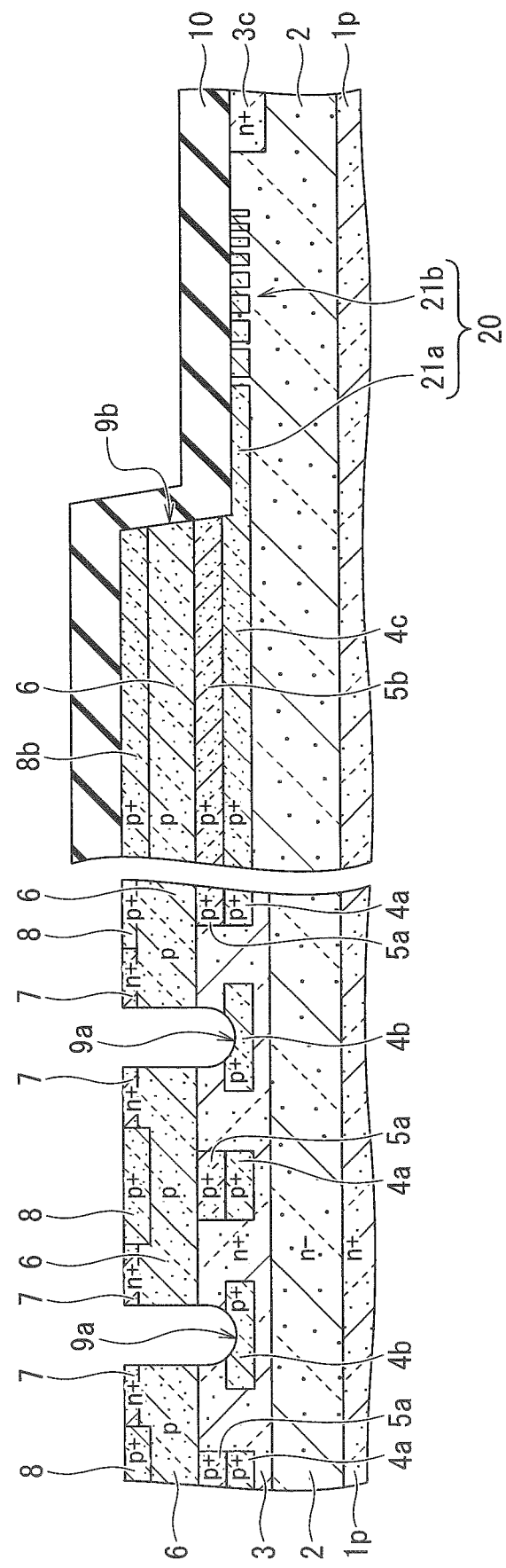
FIG. 15 is a schematic cross-sectional view illustrating an example of a process subsequent to FIG. 14 in the manufacturing method of the semiconductor device according to the embodiment of the present invention.

After removing the carbon film, a field oxide film is deposited on an exposed surface by CVD technique and the like. A photoresist film is coated on a top surface of the field oxide film, and the photoresist film is delineated by photolithography technique and the like. The delineated photoresist film is used as an etching mask to selectively remove the field oxide film. As a result, as illustrated in FIG. 15, the field oxide film 10 is formed to extend from the bottom surface and the sidewall of the mesa groove 9b to the top surface of the base contact region 8b.

Figure 16:
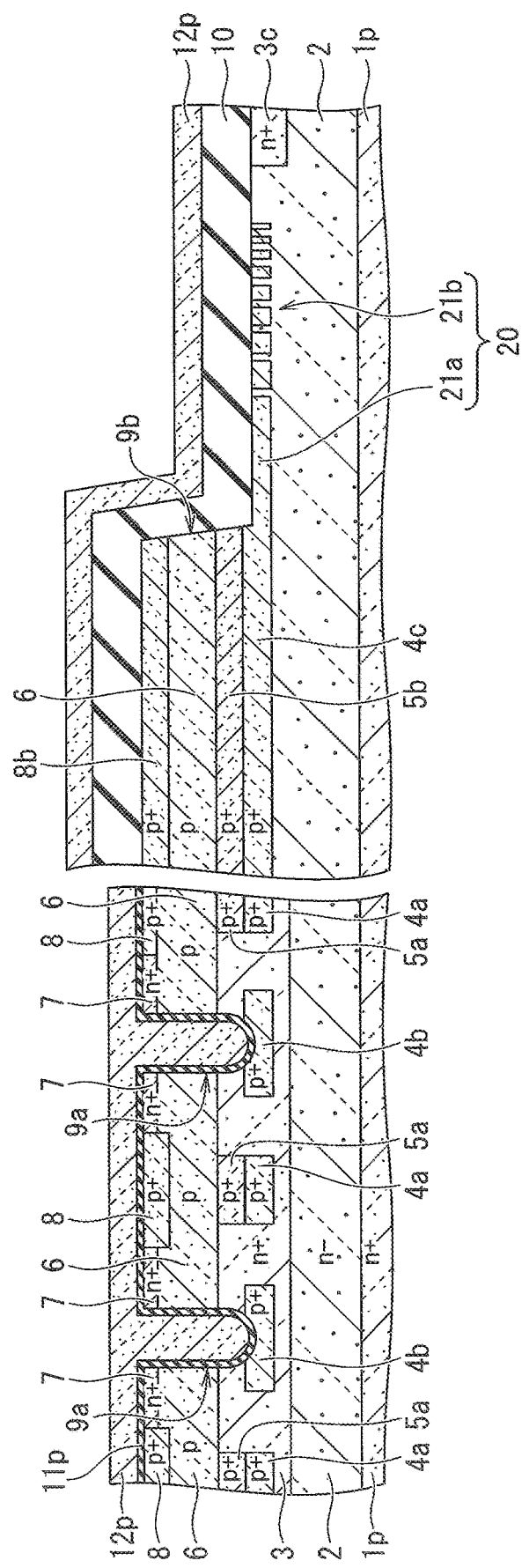
FIG. 16 is a schematic cross-sectional view illustrating an example of a process subsequent to FIG. 15 in the manufacturing method of the semiconductor device according to the embodiment of the present invention.

As illustrated in FIG. 16, the gate insulating film 11p, such as a $SiO_2$ film and the like, is formed on the bottom surface and sidewall of the trench 9a, and the top surfaces of the source region 7 and the base contact region 8 by thermal oxidation method or chemical vapor deposition (CVD) technique. Then, a polysilicon layer (a doped polysilicon layer) 12p in which impurity atoms, such as phosphorus (P), boron (B) and the like, are doped at a high concentration is deposited so as to fill the trench 9a by CVD technique and the like. As illustrated in FIG. 16, the polysilicon layer 12p extends to cover the sidewall and the bottom surface of the mesa groove 9b.

Figure 17:
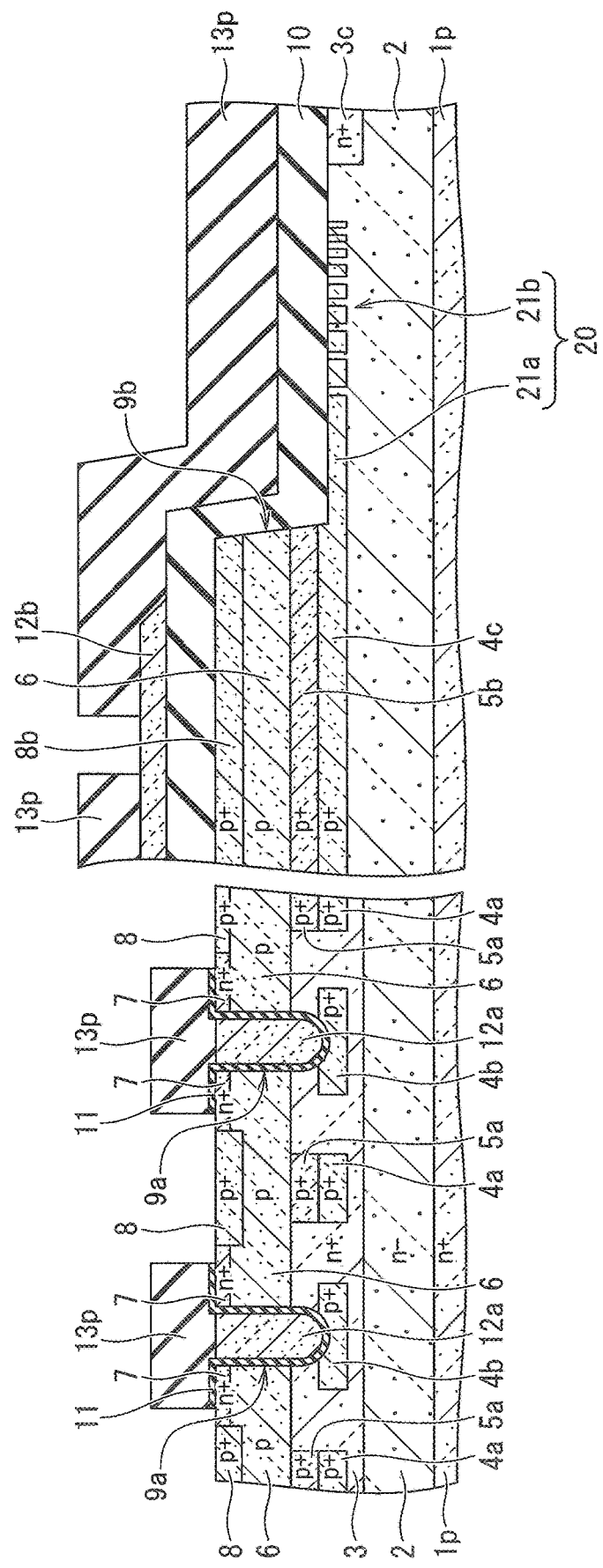
FIG. 17 is a schematic cross-sectional view illustrating an example of a process subsequent to FIG. 16 in the manufacturing method of the semiconductor device according to the embodiment of the present invention.

Then, a part of the polysilicon layer 12p and a part of the gate insulating film 11p are selectively removed by photolithography technique and dry etching. As illustrated in FIG. 17, the gate insulating film 11 and the gate electrode 12a of the polysilicon layer are delineated to form the insulated-gate electrode structure (11, 12a). Further, in the vicinity of the mesa groove 9b, the interconnection layer 12b electrically connected to the gate electrode 12a is formed on the top surface of the field oxide film 10. Thereafter, an insulating film is deposited on the top surface of the insulated-gate electrode structure (11, 12a) implemented by the gate electrode 12a and the gate insulating film 11 by CVD technique and the like. For the insulating film, boro-phospho silicate glass (BPSG), NSG, and the like may be used. Then, a part of the deposited insulating film is selectively removed by photolithography technique, dry etching technique and the like. As a result, as illustrated in FIG. 17, a source-electrode contact-hole and a gate-electrode-pad contact-hole are opened in the interlayer insulating film 13p. Although not illustrated, a gate contact-hole is also opened in the interlayer insulating film 13p so as to expose a part of the gate surface electrode connected to the gate electrode 12a at a position different from the source-electrode contact-hole.

Figure 18:
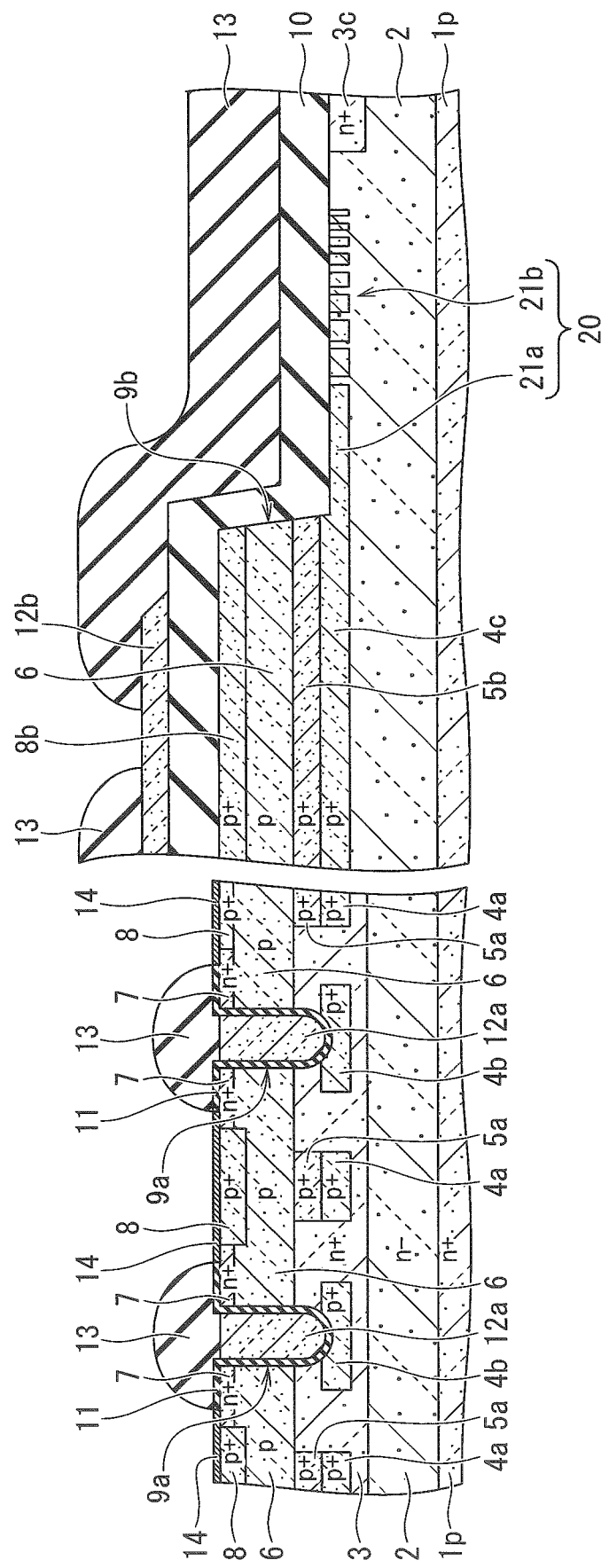
FIG. 18 is a schematic cross-sectional view illustrating an example of a process subsequent to FIG. 17 in the manufacturing method of the semiconductor device according to the embodiment of the present invention.

The substrate on which the interlayer insulating film 13p has been formed is subjected to reflow processing by annealing and the like. The reflow processing rounds steep steps at edges of the interlayer insulating film 13p. As a result, as illustrated in FIG. 18, the interlayer insulating film 13 in which the openings of the source-electrode contact-holes and the gate-electrode-pad contact-hole are rounded is formed.

Figure 19:
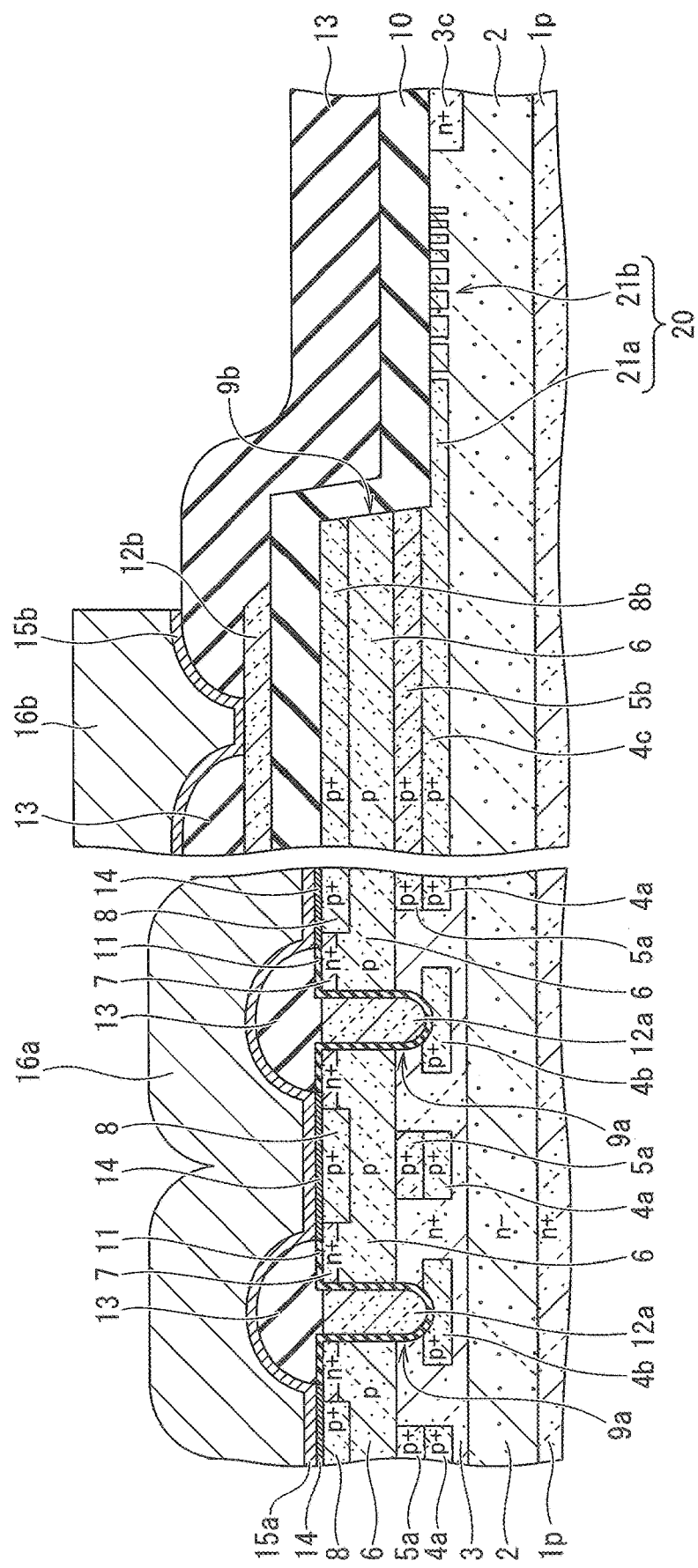
FIG. 19 is a schematic cross-sectional view illustrating an example of a process subsequent to FIG. 18 in the manufacturing method of the semiconductor device according to the embodiment of the present invention.

A metallic layer, such as a Ni film and the like, is deposited by sputtering method, evaporation method and the like, and the deposited metallic layer is delineated by photolithography technique, RIE technique and the like. Thereafter, the source contact layer 14 is formed by rapid thermal annealing (RTA), for example, at about 1000° C. Then, a metallic layer, such as a TiN film and the like, is deposited by sputtering technique and the like, and the deposited metallic layer is delineated by photolithography technique, RIE technique and the like, to form the barrier-metal layers 15a, 15b. As a result, as illustrated in FIG. 19, the source contact layer 14 is formed on the top surfaces of the source region 7 and the base contact region 8, and the barrier-metal layer 15a is formed so as to cover the interlayer insulating film 13. Further, the barrier metal layer 15b is formed on the top surface of the interconnection layer 12b so as to cover the interlayer insulating film 13. Then, a metallic layer, such as an Al film and the like, is deposited by sputtering method and the like. The metallic layer such as the Al film is delineated by photolithography technique, RIE technique and the like, to form patterns of the source electrode 16a, the gate electrode pad 16b and the gate surface electrode (not illustrated). As a result, the patterns of the source electrode 16a and the gate surface electrode are separated, and the gate electrode pad 16b is electrically connected to the gate electrode 12a via the interconnection layer 12b.

Further, the bottom surface of the substrate 1p is polished by chemical mechanical polishing (CMP) and the like to adjust a thickness, thereby forming the drain region 1. Thereafter, the drain electrode 17 made of Au and the like is deposited on the entire bottom surface of the drain region 1 by sputtering method, evaporation method and the like. Thus, the trench gate semiconductor device illustrated in FIG. 2 is completed.

In the manufacturing method of the semiconductor device according to the embodiment, the trench and the mesa-groove can be simultaneously etched to form the trench and the mesa-groove with comparable groove depths. Therefore, a number of exposure masks used in the photolithography process can be reduced by one. Moreover, the man-hours required for the processes, such as photolithography, dry etching and the like, of forming the trench and the mesa-groove can be reduced, and it is possible to cut the cost of semiconductor devices.

Other Embodiments

While the insulated gate semiconductor device according to the embodiment of the present invention has been described, it should be understood that the present invention is not intended to be limited to the descriptions of the specification and the drawings implementing part of this disclosure. Various alternative embodiments, examples, and technical applications will be apparent to those skilled in the art according to this disclosure.

As described above, in the semiconductor device according to the embodiment, the JTE structure having the main body 21a and the spatial modulation portions 21b is used as the electric-field relaxation region 20. However, guard rings using the first base-bottom embedded region 4c may be used as the electric field relaxation region 20. Further, in the above description, the trench (first groove) 9a is the narrow groove of 1 μm or less, whereas the mesa groove (second groove) 9b is the wide groove of 5 μm or more and 400 μm or less. However, the width of the second groove 9b is not limited and may be 5 μm or less. For example, the second groove 9b has a groove width different from that of the trench 9a, and may be used as another gate of a trench gate MOSFET along with the trench 9a.

As described above, it should be noted that the present invention includes various embodiments, which are not disclosed herein, including elements optionally modified as alternatives to those illustrated in the above embodiments and modified examples. Therefore, the scope of the present invention is defined only by the technical features specifying the invention prescribed by the claims reasonably derived from the description heretofore.

What is claimed is:
1. A method for adjusting a groove depth, comprising:
preparing masks having different thicknesses on respective top surfaces of a plurality of substrates made of silicon carbide;
forming a first opening having a predetermined width and a second opening having a width wider than the first opening in each of the masks;

simultaneously forming a first groove and a second groove in each of the substrates by selectively etching via the first opening and the second opening;

measuring a depth ratio of the first groove to the second groove in each of the substrates;

acquiring a thickness of a mask such that the depth ratio is an intended value, from a relationship between each thickness of the masks and each depth ratio in the substrate; and simultaneously etching the first groove and the second groove based on the intended value of the depth ratio.

2. The method according to claim 1, wherein the width of the first opening is 1 μm or less, and the width of the second opening is 5 μm or more and 400 μm or less.

3. The method according to claim 1, wherein the intended value of the depth ratio is 1±0.05.

4. The method according to claim 1, wherein the mask is made of silicon dioxide.

5. The method according to claim 1, wherein the first groove and the second groove are formed by plasma-etching using a gas mixture including a fluorine-based gas, or a hydrogen bromide gas.

6. A method for manufacturing a semiconductor device, comprising:

obtaining a first width of a trench which implements an insulated gate structure arranged in an active area and a second width of a mesa-groove which is arranged so as to surround the active portion in an outer-edge area, the second width being wider than the first width;

acquiring a mask thickness capable of etching the trench having the first width and the mesa-groove having the second width to the same depth by:

preparing masks having different thicknesses on respective top surfaces of a plurality of substrates made of silicon carbide, forming a first opening having a predetermined width and a second opening having a width wider than the first opening in each of the masks, simultaneously forming a first groove and a second groove in each of the substrates by selectively etching via the first opening and the second opening, measuring a depth ratio of the first groove to the second groove in each of the substrates, and acquiring a thickness of a mask such that the depth ratio is an intended value, from a relationship between each thickness of the masks and each depth ratio in the substrate;

forming a base region of a second conductive type on a top surface of a drift region of a first conductive type in a target substrate made of silicon carbide;

selectively forming a source region of the first conductive type having a higher impurity concentration than the drift region in an upper portion of the base region;

depositing a target mask on top surfaces of the source region and the base region with the mask thickness;

forming a first opening having the first width and a second opening having the second width in the target mask;

simultaneously forming the trench and the mesa-groove in the target substrate by selectively etching via the first opening and the second opening; and forming an insulated-gate electrode structure in the trench.

7. The method according to claim 6, wherein the first width is 1 μm or less, and the second width is 5 μm or more and 400 μm or less.

8. The method according to claim 6, wherein the depth ratio is 1±0.05.

9. The method according to claim 6, wherein the target mask is made of silicon dioxide.

10. The method according to claim 6, wherein the trench and the mesa-groove are formed by plasma-etching using a gas mixture including a fluorine-based gas, or a hydrogen bromide gas.

11. The method according to claim 6, wherein a channel stopper is formed before simultaneously forming the trench and the mesa-groove.

12. The method according to claim 6, wherein an electric-field relaxation region is formed before simultaneously forming the trench and the mesa groove.

* * * * *